United States Patent
Horiuchi et al.

(10) Patent No.: US 8,324,513 B2
(45) Date of Patent: Dec. 4, 2012

(54) WIRING SUBSTRATE AND SEMICONDUCTOR APPARATUS INCLUDING THE WIRING SUBSTRATE

(75) Inventors: Michio Horiuchi, Nagano (JP); Yasue Tokutake, Nagano (JP); Yuichi Matsuda, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 164 days.

(21) Appl. No.: 13/009,987

(22) Filed: Jan. 20, 2011

(65) Prior Publication Data

US 2011/0175235 A1    Jul. 21, 2011

(30) Foreign Application Priority Data

Jan. 21, 2010  (JP) ................. 2010-010950

(51) Int. Cl.
*H05K 1/11* (2006.01)

(52) U.S. Cl. ........ 174/262; 174/250; 174/261; 361/748; 257/784; 257/E23.01; 257/E23.011

(58) Field of Classification Search ............... 174/250, 174/257, 260–262; 361/748, 784, 792; 257/784, 257/E23.01, E23.169, E23.011, E23.168, 257/668, 774, 773, 778, 737
See application file for complete search history.

(56) References Cited

U.S. PATENT DOCUMENTS

| | | | |
|---|---|---|---|
| 4,463,084 A | 7/1984 | Mitsumori et al. | |
| 5,185,502 A * | 2/1993 | Shepherd et al. | 174/262 |
| 6,093,476 A | 7/2000 | Horiuchi et al. | |
| 6,720,501 B1 * | 4/2004 | Henson | 174/262 |
| 2003/0222288 A1* | 12/2003 | Schaper | 257/259 |
| 2011/0095433 A1* | 4/2011 | Horiuchi et al. | 257/773 |
| 2011/0100700 A1* | 5/2011 | Kariya et al. | 174/267 |
| 2011/0220404 A1* | 9/2011 | Yamasaki et al. | 174/261 |

FOREIGN PATENT DOCUMENTS

| | | |
|---|---|---|
| JP | 58-137915 | 8/1983 |
| JP | 58-141595 | 8/1983 |
| JP | 10-308565 | 11/1998 |
| JP | 2004-273480 | 9/2004 |
| JP | 2009-147241 | 7/2009 |

* cited by examiner

*Primary Examiner* — Hoa C Nguyen
(74) *Attorney, Agent, or Firm* — IPUSA, PLLC

(57) ABSTRACT

A wiring substrate includes a core substrate including an inorganic dielectric insulating base material having first and second surfaces, and linear conductors penetrating the insulating base; a first wiring layer on the first surface electrically connected to a portion of linear conductors; a second wiring layer on the second surface electrically connected to the portion of the linear conductors; a first insulating layer on the first surface covering the first wiring layer and including a first through-hole; a third wiring layer on the first insulating layer electrically connected to the first wiring layer via the first through-hole; a second insulating layer on the second surface covering the second wiring layer and including a second through-hole; and a fourth wiring layer on the second insulating layer electrically connected to the second wiring layer via the second through-hole.

8 Claims, 15 Drawing Sheets

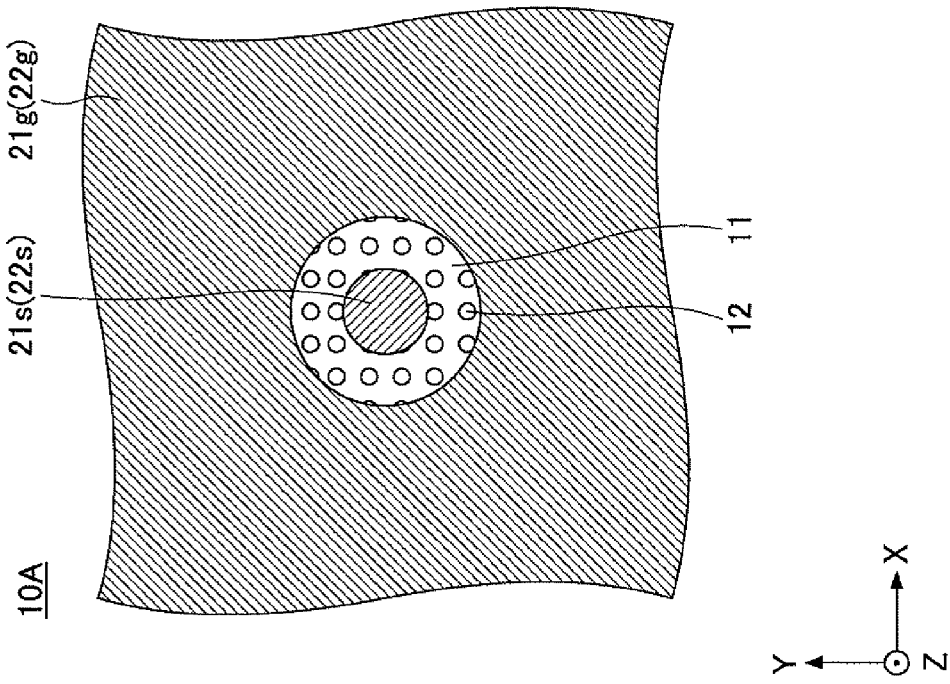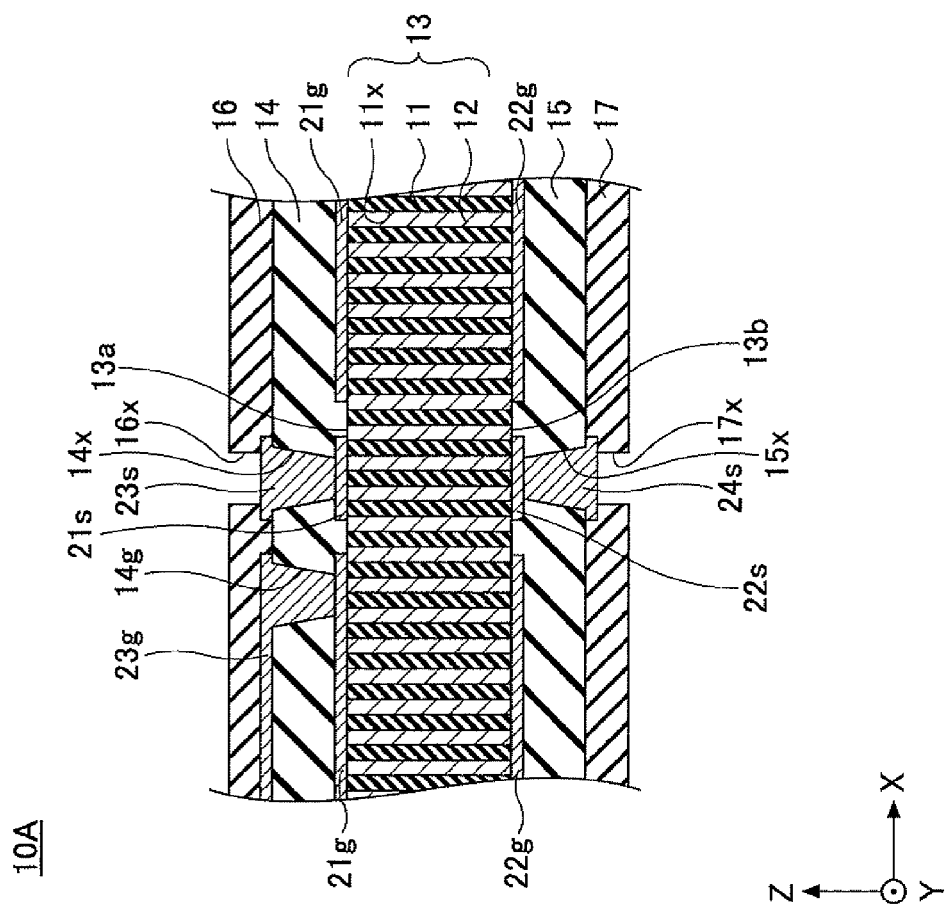

WIRING SUBSTRATE AND SEMICONDUCTOR APPARATUS INCLUDING THE WIRING SUBSTRATE

BACKGROUND OF THE INVENTION

1. Field of the Invention

The present invention generally relates to a wiring substrate and a semiconductor apparatus including the wiring substrate, for example, a wiring substrate having plural linear conductors and a semiconductor apparatus having the wiring substrate on both sides of the linear conductors.

2. Description of the Related Art

There is known a semiconductor apparatus having a semiconductor device mounted on a wiring substrate. A related art example of a semiconductor apparatus 300 having a semiconductor device 400 mounted on a wiring substrate (multilayer wiring substrate) 500 is described with reference to FIG. 1. FIG. 1 is a cross-sectional view of the related art example of the semiconductor apparatus 300 having the semiconductor device 400 mounted on the wiring substrate 500. With reference to FIG. 1, the semiconductor apparatus 300 includes the multilayer wiring substrate 500, the semiconductor device 400, solder bumps 410, and an underfill resin layer 420. A support body 510 is provided at a center part of the multilayer wiring substrate 500.

The support body 510 includes first and second surfaces 510a, 510b. A first wiring layer 610a is formed on the first surface 510a. Further, the support body 510 includes through-vias 690 penetrating through the support body from the first surface 510a to the second surface 510b. The first wiring layer 610a is electrically connected to the below-described fourth wiring layer via the through-vias 690. Further, a first insulating layer 520a is formed in a manner covering the first wiring layer 610a. A second wiring layer 620a is formed on the first insulating layer 520a. The first wiring layer 610a and the second wiring layer 620a are electrically connected to each other via via-holes 520x penetrating through the first insulating layer 520a.

Further, a second insulating layer 530a is formed in a manner covering the second wiring layer 620a. A third wiring layer 630a is formed on the second insulating layer 530a. The second wiring layer 620a and the third wiring layer 630a are electrically connected to each other via via-holes 530x penetrating through the second insulating layer 530a.

A solder-resist layer 550a including opening parts 550x is formed in a manner covering the third wiring layer 630a. Regions (portions) of the third wiring layer 630a that are exposed at the opening parts 550x of the solder-resist layer 550a function as electrode pads (the portions of the third wiring layer 630a that are exposed at the opening parts 550a may hereinafter also be referred to as "electrode pads 630a"). Further, the surface on which the electrode pads 630a are formed may hereinafter also be referred to as a first surface of the multilayer wiring substrate 500.

A fourth wiring layer 610b is formed on the second surface 510b of the support body 510. Further, a third insulating layer 520b is formed in a manner covering the fourth wiring layer 610b. A fifth wiring layer 620b is formed on the third insulating layer 520b. The fourth wiring layer 610b and the fifth wiring layer 620b are electrically connected to each other via via-holes 520y penetrating through the third insulating layer 520b.

Further, a solder-resist layer 550b including opening parts 550y is formed in a manner covering a sixth wiring layer 630b. Regions (portions) of the sixth wiring layer 630b that are exposed at the opening parts 550y of the solder-resist layer 550b function as electrode pads (the portions of the sixth wiring layer 630b that are exposed at the opening parts 550y may hereinafter also be referred to as "electrode pads 630b"). Further, the surface on which the electrode pads 630b are formed may hereinafter also be referred to as a second surface of the multilayer wiring substrate 500.

Solder bumps 680 are formed on the electrode pads 630b. The solder bumps 680 function as outer connection terminals electrically connected to corresponding terminals of a circuit board (not illustrated) such as a motherboard when mounting the semiconductor apparatus 300 on the circuit board.

The semiconductor device 400 is mounted on the first surface of the multilayer wiring substrate 500. The semiconductor device 400 may be a semiconductor integrated circuit (not illustrated) or an electrode pad (not illustrated) formed on a thin semiconductor substrate (not illustrated) made of silicon or the like. Solder bumps 410 are formed on electrode pads (not illustrated) of the semiconductor device 400.

The electrode pads (not illustrated) of the semiconductor device 400 are electrically connected to corresponding electrode pads 630a of the multilayer wiring substrate 500 via the solder bumps 410. The material of the solder bumps 410 may be, for example, an alloy of Sn and Cu, an alloy of Sn and Ag, or an alloy of Sn, Ag, and Cu. The underfill resin layer 420 is formed between the semiconductor device 400 and the solder resist layer 550a.

Further, there is known a semiconductor apparatus including a wiring substrate having semiconductor devices mounted on first and second sides of the wiring substrate. Next, with reference to FIG. 2, there is described an example of a semiconductor apparatus including a wiring substrate having semiconductor devices mounted on first and second sides of the wiring substrate. FIG. 2 is a cross-sectional view illustrating a related art example of a semiconductor apparatus 700 including a wiring substrate 800 having semiconductor devices 900, 950 mounted on first and second sides of the wiring substrate 800. In FIG. 2, the semiconductor apparatus 700 includes the wiring substrate 800, the semiconductor device 900, solder bumps 910, the semiconductor device 950, and solder bumps 960.

The wiring substrate 800 includes a substrate body 810 made of silicon. The substrate body 810 has first and second surfaces 810a, 810b. A first wiring layer 820a is formed on the first surface 810a of the substrate body 810. Further, the substrate body 810 includes through-vias 830 penetrating the substrate body 810 from the first surface 810a to the second surface 810b. The first wiring layer 820a is electrically connected to the below-described second wiring layer 820b via the through-vias 830. Further, a solder-resist layer 840a is formed in a manner covering the first wiring layer 820a. Regions (portions) of the first wiring layer 820a that are exposed at opening parts 840x of the solder-resist layer 840a function as electrode pads (the portions of the first wiring layer 820a that are exposed at the opening parts 840x may hereinafter also be referred to as "electrode pads 820a"). Further, the surface on which the electrode pads 820a are formed may hereinafter also be referred to as a first surface of the wiring substrate 800.

The second wiring layer 820b is formed on the second surface 810b of the substrate body 810. Further, a solder-resist layer 840b is formed in a manner covering the second wiring layer 820b. Regions (portions) of the second wiring layer 820b that are exposed at opening parts 840y of the solder-resist layer 840b function as electrode pads (the portions of the second wiring layer 820b that are exposed at the opening parts 840y may hereinafter also be referred to as "electrode pads 820b"). Further, the surface on which the electrode pads 820b are formed may hereinafter also be referred to as a second surface of the wiring substrate 800.

Solder bumps 850 are formed on some of the electrode pads 820b. The solder bumps 850 function as outer connection terminals electrically connected to corresponding terminals of a circuit board (not illustrated) such as a motherboard when mounting the semiconductor apparatus 700 on the circuit board.

The semiconductor device 900 is mounted on the first surface of the wiring substrate 800. The semiconductor device 900 may be a semiconductor integrated circuit (not illustrated) or an electrode pad (not illustrated) formed on a thin semiconductor substrate (not illustrated) made of silicon or the like. The semiconductor device 900 may be, for example, a memory device. Solder bumps 910 are formed on electrode pads (not illustrated) of the semiconductor device 900.

The electrode pads (not illustrated) of the semiconductor device 900 are electrically connected to corresponding electrode pads 820a of the wiring substrate 800. The material of the solder bumps 910 may be, for example, an alloy of Sn and Cu, an alloy of Sn and Ag, or an alloy of Sn, Ag, and Cu.

The semiconductor device 950 is mounted on the second surface of the wiring substrate 800. The semiconductor device 950 may be a semiconductor integrated circuit (not illustrated) or an electrode pad (not illustrated) formed on a thin semiconductor substrate (not illustrated) made of silicon or the like. The semiconductor device 950 may be, for example, a logic device. Solder bumps 960 are formed on electrode pads (not illustrated) of the semiconductor device 950.

The electrode pads (not illustrated) of the semiconductor device 950 are electrically connected to corresponding electrode pads 820b of the wiring substrate 800. The material of the solder bumps 960 may be, for example, an alloy of Sn and Cu, an alloy of Sn and Ag, or an alloy of Sn, Ag, and Cu.

However, in a case of the semiconductor apparatus 300 using the multilayer wiring substrate 500, it is difficult to connect the first surface of the multilayer wiring substrate 500 and the second surface of the multilayer wiring substrate 500 without having to extend or arrange each of the wiring layers in a plan direction (i.e. X direction, Y direction, or both) due to, for example, fabrication limitations of the support body 510 or the through-vias 690. Thus, the first surface of the multilayer wiring substrate 500 cannot be connected to the second surface of the multilayer wiring substrate 500 with either a narrow pitch or at a short distance.

As in the case of the semiconductor apparatus 700, by forming the through-vias 830 with a method of forming through-holes in the silicon substrate body 810 and filling the through-holes with a metal material or the like (i.e. so-called TSV (Through Silicon Via), the first surface of the multilayer wiring substrate 500 can be connected to the second surface of the multilayer wiring substrate 500 by the through-vias 830 without having to extend or arrange the wiring layers in a plan view direction (i.e. X direction, Y direction, or both). Such a method of forming the through-vias (TSV) results in high manufacturing cost and has limitations with respect to the size of the semiconductor device to be mounted on the wiring substrate.

SUMMARY OF THE INVENTION

The present invention may provide a wiring substrate and a semiconductor apparatus including the wiring substrate that substantially eliminates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a wiring substrate and a semiconductor apparatus including the wiring substrate particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a wiring substrate having a core substrate including an insulating base material made of an inorganic dielectric material and having first and second surfaces, and plural linear conductors penetrating through the insulating base material from the first surface to the second surface; a first wiring layer formed on the first surface and electrically connected to a portion of the plural linear conductors at the first surface; a second wiring layer formed on the second surface and electrically connected to the portion of the plural linear conductors at the second surface; a first insulating layer being formed on the first surface in a manner covering the first wiring layer and including a first through-hole; a third wiring layer formed on the first insulating layer and electrically connected to the first wiring layer via the first through-hole; a second insulating layer being formed on the second surface in a manner covering the second wiring layer and including a second through-hole; and a fourth wiring layer formed on the second insulating layer and electrically connected to the second wiring layer via the second through-hole.

Other objects and further features of the present invention will be apparent from the following detailed description when read in conjunction with the accompanying drawings.

BRIEF DESCRIPTION OF THE DRAWINGS

FIGS. 12A and 12B illustrate a portion of a wiring substrate according to a modified example of the first embodiment of the present invention;

DESCRIPTION OF THE PREFERRED EMBODIMENTS

In the following, embodiments of the present invention will be described with reference to the accompanying drawings.
[First Embodiment]
(Configuration of Wiring Substrate)

Figure 1:
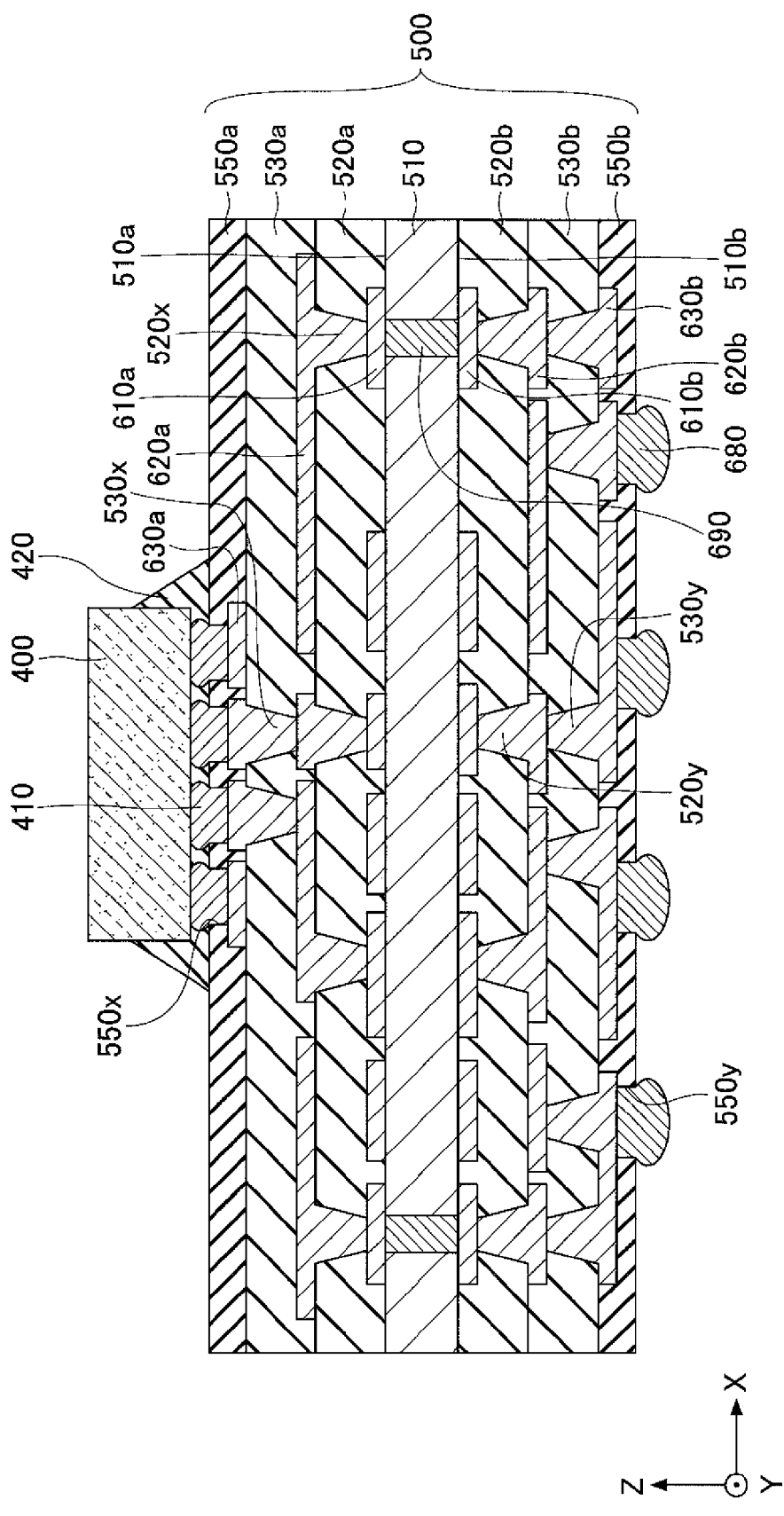
FIG. 1 is a cross-sectional view of a related art example of a semiconductor apparatus having a semiconductor device mounted on a wiring substrate (part 1)
Figure 2:
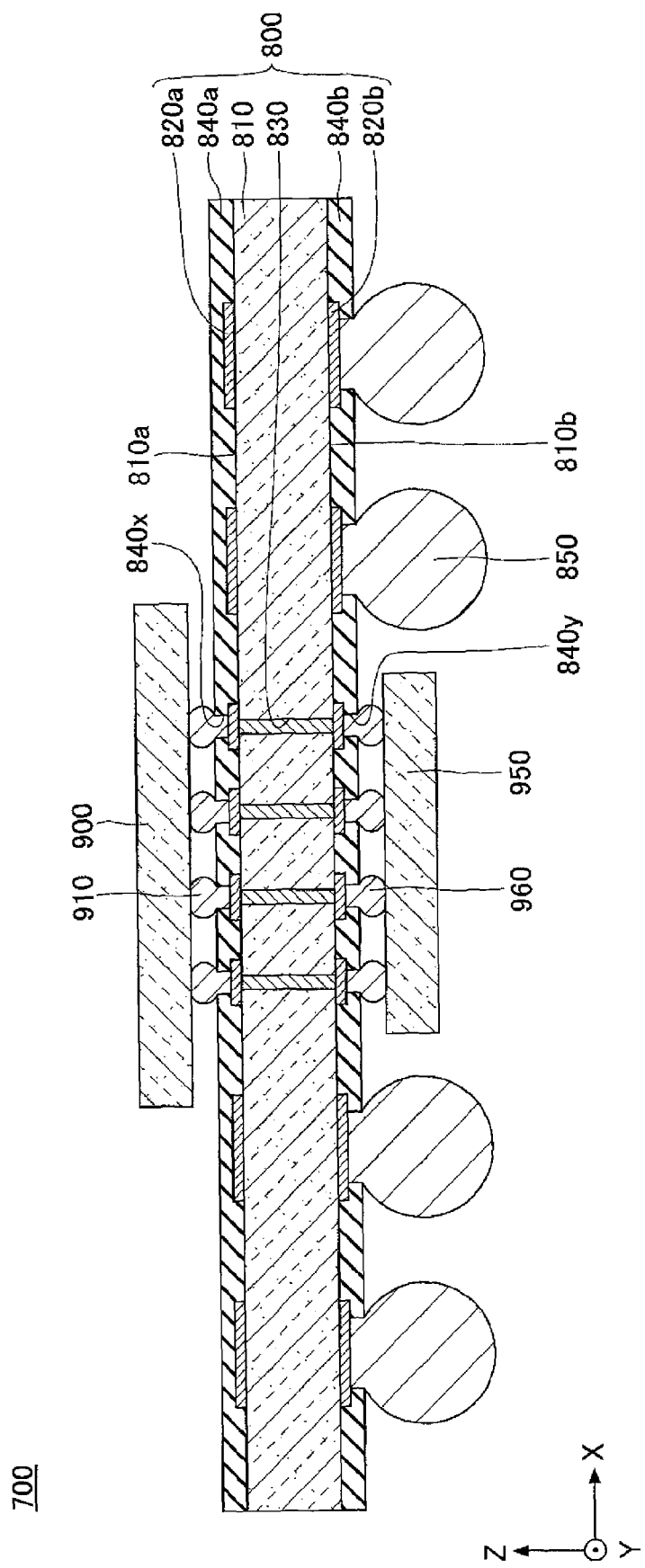
FIG. 2 is another cross-sectional view of a related art example of a semiconductor apparatus having a semiconductor device mounted on a wiring substrate (part 2)
Figure 3:
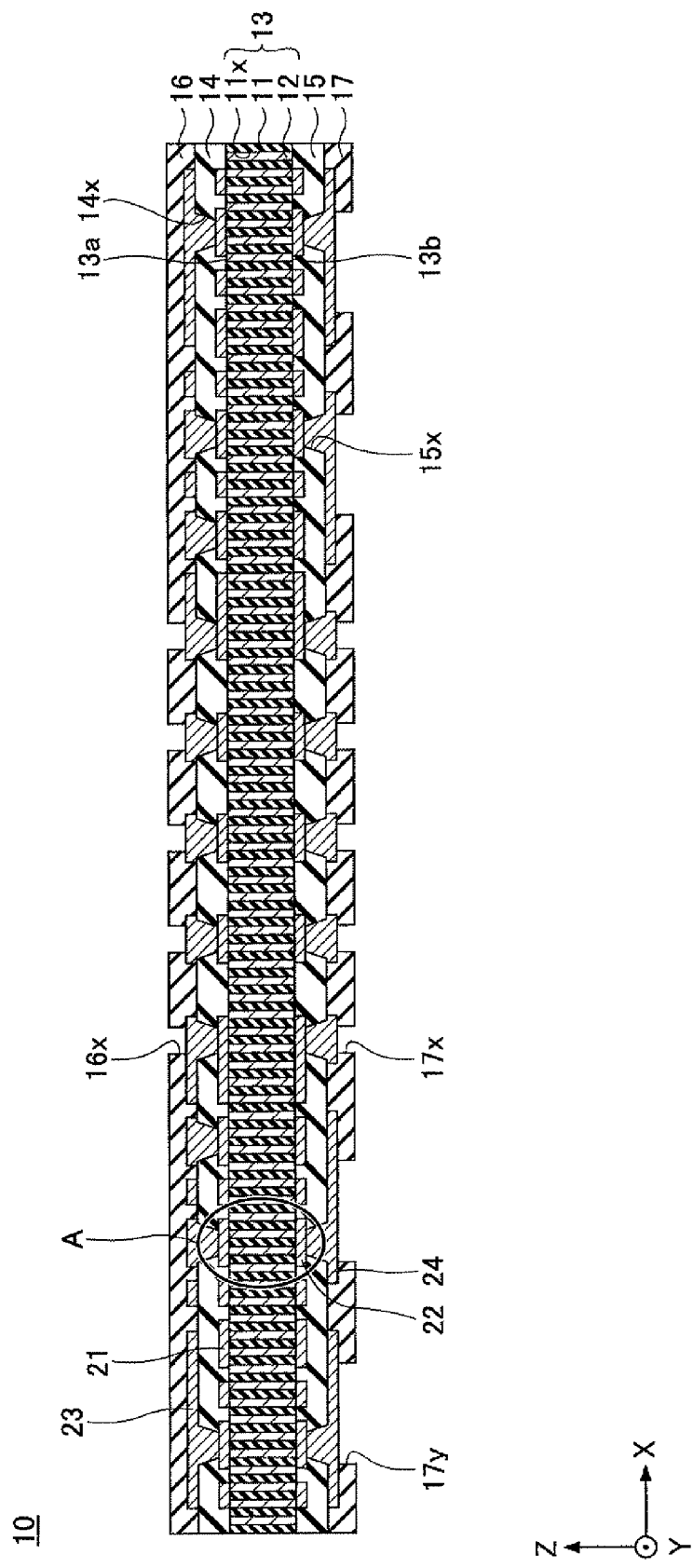
FIG. 3 is a cross-sectional view illustrating an example of a wiring substrate according to a first embodiment of the present invention.
Figure 4:
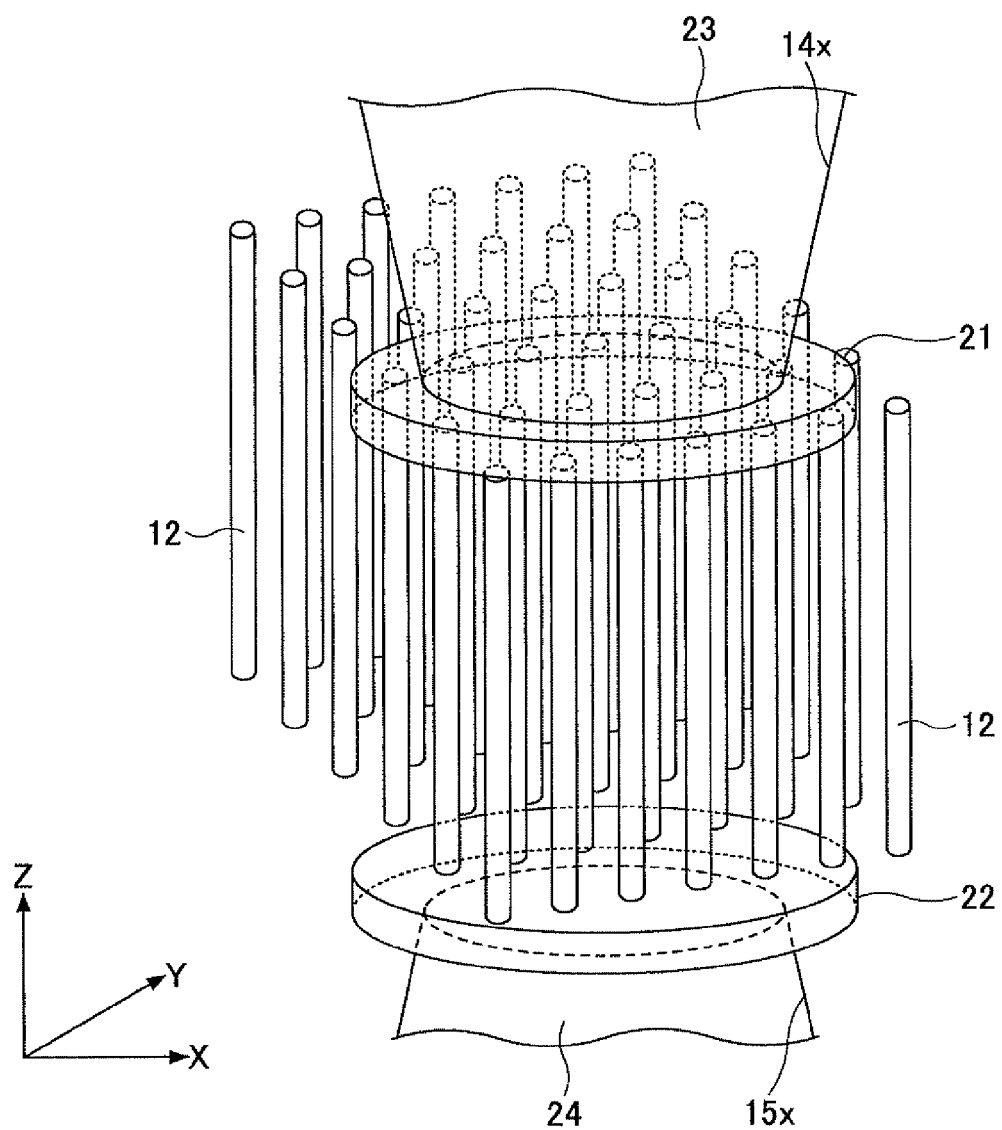
FIG. 4 is an enlarged perspective transparent view of a portion A of FIG. 3.

A configuration of a wiring substrate 10 according to the first embodiment of the present invention is described. FIG. 3 is a cross-sectional view illustrating an example of the wiring substrate 10 according to the first embodiment of the present invention. FIG. 4 is an enlarged perspective transparent view of a portion A of FIG. 3. It is, however, to be noted that some components/elements are omitted in FIG. 4. In FIGS. 3 and 4, the X direction indicates a direction that is parallel to a first surface 13a of a below-described core substrate 13, the Y direction indicates a direction orthogonal to the X direction, and the Z direction indicates a direction orthogonal to both the X direction and the Y direction (i.e. thickness direction of the core substrate 13).

With reference to FIGS. 3 and 4, the wiring substrate 10 includes the core substrate 13, a first insulating layer 14, a second insulating layer 15, a first solder-resist layer 16, a second solder-resist layer 17, a first wiring layer 21, a second wiring layer 22, a third wiring layer 23, and a fourth wiring layer 24.

The core substrate 13 has a thickness of, for example, approximately 70-100 μm and a size of, for example, approximately 10 mm×10 mm. The core substrate 13 includes an insulating base material 11 having plural through-holes 11x formed throughout the insulating base material 11 in the Z direction (thickness direction). Further, the core substrate 13 includes linear conductors (vias) 12 that are formed in the through-holes 11x by filling the through-holes 11x with a metal material. The material of the insulating base material 11 is preferably a material having high dielectric constant (inorganic dielectric material) such as alumina (aluminum oxide), mullite, aluminum nitride, glass-ceramic (compound material of glass and ceramic), barium strontium titanium oxide, barium titanium oxide, strontium titanium oxide, and lead zirconate titanate. For example, alumina (aluminum oxide) has a dielectric constant ranging from 8 to 10, and mullite has a dielectric constant of 6.5.

Although semiconductor devices can be mounted on both surfaces of the wiring substrate 10, the semiconductor device has a thermal expansion coefficient (CTE (Coefficient of Thermal Expansion)) of approximately 3 ppm/° C. in a case where the semiconductor device is made of, for example, silicon. Further, the first wiring layer 21 has a CTE ranging from approximately 16 ppm/° C. to 17 ppm/° C. in a case where, for example, the first wiring layer 21 formed on the wiring substrate 10 is made of copper (Cu). For example, in order to relieve the generation of stress due to the difference of CTEs between the semiconductor devices mounted on the wiring substrate 10 and the first wiring layer 21, a material having a CTE ranging between the CTE of the semiconductor device and the CTE of the first wiring layer 21 may be used as the insulating base material 11. For example, in a case where alumina having a CTE ranging from approximately 6 ppm/° C. to 7 ppm/° C. or mullite having a CTE of approximately 4.5 ppm/° C. is used as the insulating base material 11, the insulating base material 11 may be made of ceramic having a CTE ranging between the CTE of the semiconductor device and the CTE of the first wiring layer 21.

The linear conductors 12 have first end surfaces exposed at the first surface 13a of the core substrate 13 and second end surfaces exposed at a second surface 13b of the core substrate 13. For example, the linear conductors have circle shapes from a plan view (i.e. when viewed from the Z direction in FIG. 3). The linear conductors 12 may be formed having a diameter ranging from, for example, approximately 30 nm to 2000 nm. It is preferable to densely arrange the linear conductors 12 in a manner that the interval of adjacent linear conductors 12 is less than the diameter of the linear conductors 12. However, the arrangement of the linear conductors 12 is not limited in particular. For example, the linear conductors 12 may be arranged in a manner forming a hexagonal shape or a grid-like shape.

Each of the linear conductors 12 functions as a via for connecting a first conductor formed on the first surface 13a of the core substrate 13 and a second conductor formed on the second surface 13b of the core substrate 13. A portion of the linear conductor 12 does not need to be connected to the first or second conductor and may be in an electrically isolated state (floating state). The metal material forming the linear conductor 12 may be, for example, silver (Ag), copper (Cu), or nickel (Ni).

Next, the core substrate 13 of the first embodiment is compared with a core substrate of a wiring substrate of a related art example. With the wiring substrate of the related art example, it is necessary to form through-holes (filled with conductor) in a core substrate and receiving pads on both surfaces of the through-holes in order to electrically connect the wiring layers formed on first and second surfaces of the core substrate. Further, in the case of forming the through-holes (including the receiving pads), it is necessary to prepare a specific core substrate and perform processes such as perforating, metalizing, and hole-filling on the specific core substrate in correspondence with the function of a chip component to be mounted on the wiring substrate. Accordingly, a long time is required to manufacture the specific core substrate. This leads to problems such as difficulty in efficiently manufacturing a desired core substrate and high cost for manufacturing the core substrate.

The wiring substrate of the related art example relies on, for example, the precision of processing the through-holes relative to the core substrate, the precision of aligning the through-holes relative to the core substrate, and the precision of layering (superposing) the wiring layers. Further, the wiring substrate of the related art example requires the receiving pads to have a large diameter. This adversely affects the degree of freedom in designing the wiring of the wiring substrate and restricts the density of the wiring of the wiring substrate. Particularly, because the current technology has substantially reached its limits in terms of reducing the diameter of the through-holes and reducing the pitch of the through-holes along with the growing demands for size-reduction of electronic devices, the wiring density throughout the wiring substrate is further restricted.

On the other hand, with the wiring substrate 10 of the first embodiment of the present invention, the plural linear conductors 12 penetrating the core substrate 13 from the first surface 13a to the second surface 13b can connect the first conductors formed on the first surface 13a to the second conductors formed on the second surface 13b. Accordingly, the above-described problems of the wiring substrate of the related art example can be overcome.

Returning to FIGS. 3 and 4, the first wiring layer 21 is formed on the first surface 13a of the core substrate 13. The first wiring layer 21 is electrically connected to the first end surfaces of the linear conductors 12 exposed at the first surface 13a of the core substrate 13. The material of the first wiring layer 21 may be, for example, copper (Cu).

The first insulating layer 14 is formed on the first surface 13a of the core substrate 13 in a manner covering the first wiring layer 21. The material of the first insulating layer 14 may be a resin material such as an epoxy resin or a polyimide resin.

The second wiring layer 22 is formed on the second surface 13b of the core substrate 13. The second wiring layer 22 is electrically connected to the second end surfaces of the linear connectors 12 exposed at the second surface 13b of the core substrate 13.

The second insulating layer 15 is formed on the second surface 13b of the core substrate 13 in a manner covering the second wiring layer 22. The material of the second insulating layer 15 may be a resin material such as an epoxy resin or a polyimide resin.

The third wiring layer 23 is formed on the first insulating layer 14. The third wiring layer 23 is electrically connected to the first wiring layer 21 via the first via holes 14x penetrating through the first insulating layer 14. The material of the third wiring layer may be, for example, copper (Cu).

The first solder-resist layer 16 is formed on the first insulating layer 14 in a manner covering the third wiring layer 23. The first solder-resist layer 16 includes opening parts 16x. Portions of the third wiring layer 23 are exposed at the opening parts 16x. The exposed portions of the third wiring layer 23 function as electrode pads to be connected to a semiconductor device or the like. The shape of the opening part 16x is a circle from a plan view. In the case where the shape of the opening part 16x is a circle from a plan view, the diameter of the opening part 16x ranges from, for example, approximately 20 μm to 50 μm.

The fourth wiring layer 24 is formed on the second insulating layer 15. The fourth wiring layer 24 is electrically connected to the second wiring layer 22 via the second via holes 15x penetrating through the second insulating layer 15. The material of the fourth wiring layer 24 may be, for example, copper (Cu).

The second solder-resist layer 17 is formed on the second insulating layer 15 in a manner covering the fourth wiring layer 24. The second solder-resist layer 17 includes opening parts 17x, 17y. Portions of the fourth wiring layer 24 are exposed at the opening parts 17x, 17y. The portions of the fourth wiring layer 24 exposed at the opening parts 17x function as electrode pads to be connected to a semiconductor device or the like. The portions of the fourth wiring layer 24 exposed at the opening parts 17y function as electrode pads to be connected to a substrate or the like. The shape of the opening parts 17x, 17y is a circle from a plan view. In the case where the shape of the opening part 17x is a circle from a plan view, the diameter of the opening part 17x ranges from, for example, approximately 20 μm to 50 μm. Further, the opening part 17y is to have a greater diameter than the diameter of the opening part 17x. For example, in the case where the shape of the opening part 17y is a circle from a plan view, the diameter of the opening part 17y ranges from, for example, 300 μm to 500 μm.

(Method for Manufacturing a Wiring Substrate)

Next, a method of manufacturing the wiring substrate 10 according to the first embodiment of the present invention is described. FIGS. 5-11 are schematic diagrams for describing the steps of manufacturing the wiring substrate 10 according to the first embodiment of the present invention. In FIGS. 5-11, like components are denoted with like reference numerals as of those of FIG. 3 and are not further explained.

Figure 5:
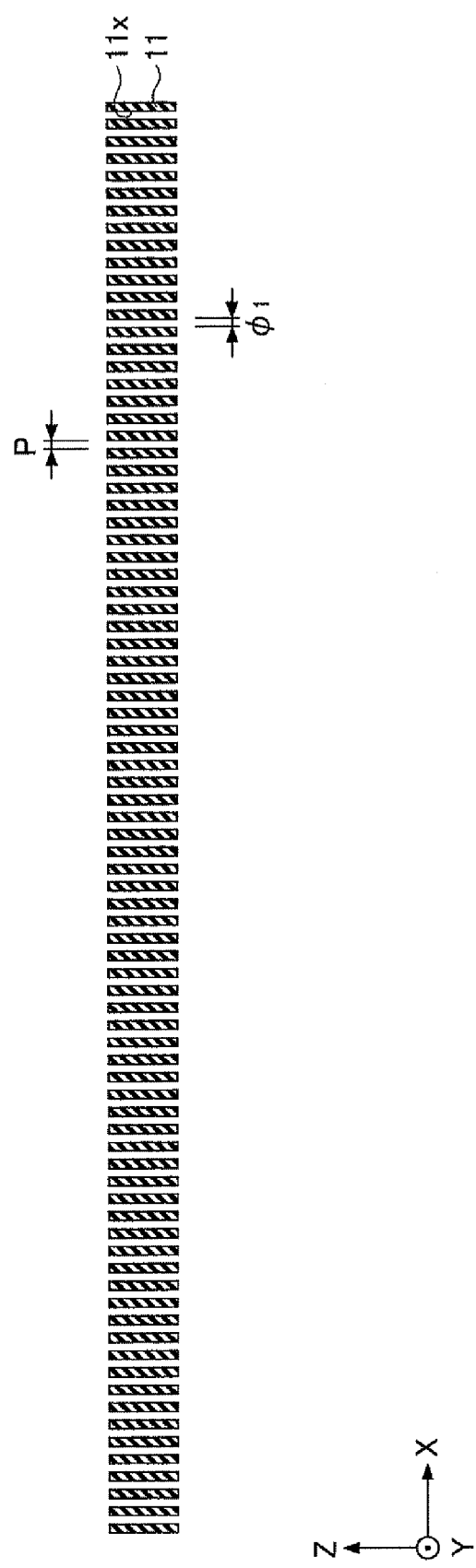
FIG. 5 is a schematic diagram for describing steps of manufacturing a wiring substrate according to the first embodiment of the present invention (part 1)

First, in the step illustrated in FIG. 5, an insulating base material 11 is prepared. Then, throughout the entire insulating base material 11, plural through-holes 11x are formed in the thickness direction of the insulating base material 11. The insulating base material 11 has a thickness ranging from, for example, approximately 70 μm to 100 μm. The insulating base material 11 may be formed having a size of, for example, approximately 10 mm×10 mm. The insulating base material 11 may be made of, for example, aluminum oxide. The shape of the through-holes 11x may be, for example, a circle from a plan view. In the case where the shape of the through-holes 11x is a circle from a plan view, the circle may have a diameter $\phi_1$ ranging from, for example, approximately 30 nm to 2000 nm. It is preferable to densely arrange the through-holes 11x in a manner that the interval (pitch) P of adjacent through-holes 11x is less than the diameter $\phi_1$ of the through-hole 11x. It is, however, to be noted that the arrangement of the through-holes 11x is not limited in particular. For example, the through-holes 11x may be arranged in a manner forming a hexagonal shape or a grid-like shape.

Next, an example of a method for forming the through-holes 11x is described. The through-holes 11x may be formed by using an anodic oxidation method. More specifically, first, there is prepared an aluminum (Al) wiring substrate having a first surface coated with an insulating film or a glass wiring substrate having an aluminum (Al) electrode layer formed thereon by sputtering or the like. Then, after cleansing the Al wiring substrate or the Al electrode layer of the glass wiring substrate, the Al wiring substrate or the glass wiring substrate is dipped in an electrolyte solution (e.g., preferably, a sulfuric acid solution) in which a platinum (Pt) electrode is positioned facing the Al wiring substrate or the glass wiring substrate. By applying a pulse voltage to the dipped Al wiring substrate or the glass wiring substrate serving as the anode (positive electrode) and the platinum electrode serving as the cathode (negative electrode), a porous metal oxide film (aluminum oxide film having regularly (consistently) arranged fine-sized holes can be formed on the surface of the Al wiring substrate or the Al electrode layer of the glass wiring substrate.

Then, the porous metal oxide film is separated from the Al wiring substrate or the Al electrode layer of the glass wiring substrate by applying an inverse potential (potential inverted with respect to the potential applied in the anodic oxidation) to both positive and negative electrodes (i.e. the Al wiring substrate or the Al electrode layer of the glass wiring substrate serving as the cathode and the platinum electrode serving as the anode). Thereby, the insulating base material 11 having densely arranged through-holes 11x with a desired small-diameter (e.g., 30 nm-200 nm) can be obtained. Other than alumina (aluminum oxide), the material of the insulating base material 11 may be, for example, mullite, aluminum nitride, glass-ceramic (compound material of glass and ceramic), barium strontium titanium oxide, barium titanium oxide, strontium titanium oxide, or lead zirconate titanate.

Figure 6:
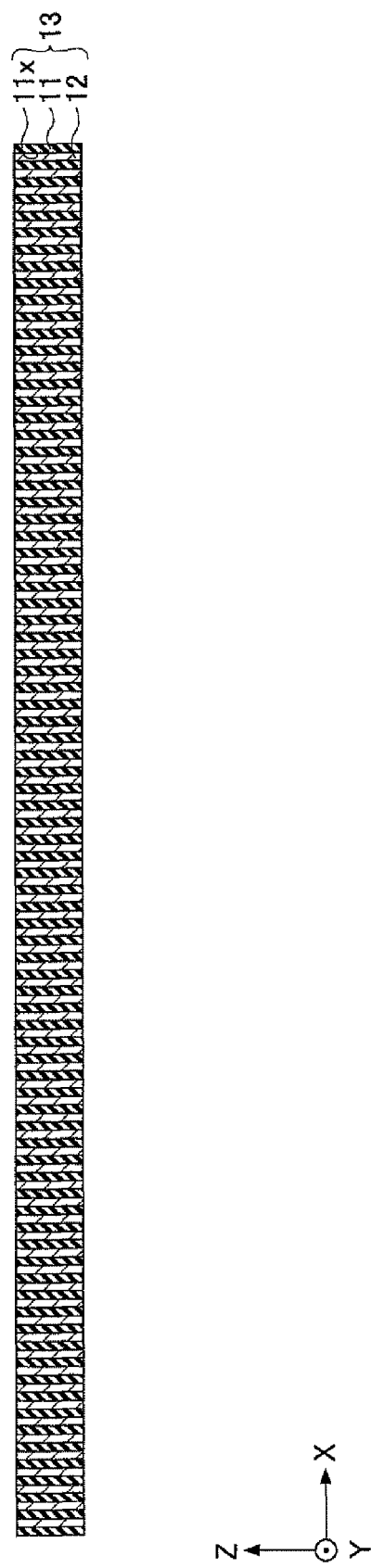
FIG. 6 is a schematic diagram for describing steps of manufacturing a wiring substrate according to the first embodiment of the present invention (part 2)

Then, in the step illustrated in FIG. 6, linear conductors (vias) 12 are formed by filling the through-holes 11x of the insulating base material 11 with a metal material. The insulating base material including the linear conductors 12 may hereinafter also be referred to as the core substrate 13. The linear conductors 12 are formed by filling the through-holes 11x with a conductive paste (e.g., silver (Ag) paste, copper (Cu) paste). The conductive paste may be supplied into the through-holes 11x by using, for example, a screen printing method or an inkjet method.

In a case where copper (Cu) is used as the metal material, a seed layer is formed on the surface of the insulating base material (including the inner sidewalls of the through-holes 11x) by using an electroless copper (Cu) plating method. Then, by using the electroless copper plating method along with using the seed layer as a feed layer, copper (Cu) can be supplied into the through-holes 11x. Alternatively, copper (Cu) can be supplied into the through-holes 11x by solely using the electroless copper plating method.

According to necessity, the surfaces on both sides of the insulating base material 11 may be flattened by using polishing methods such as a mechanical polishing method or a chemical mechanical polishing (CMP) method, so that the first and second end surfaces of the linear conductor 12 are exposed at the surfaces of both sides of the insulating base material 11. Thereby, the core substrate 13 can be formed having densely arranged small-diameter linear conductors 12 that penetrate the core substrate 13 in the Z direction (thickness direction of the core substrate 13).

Figure 7:
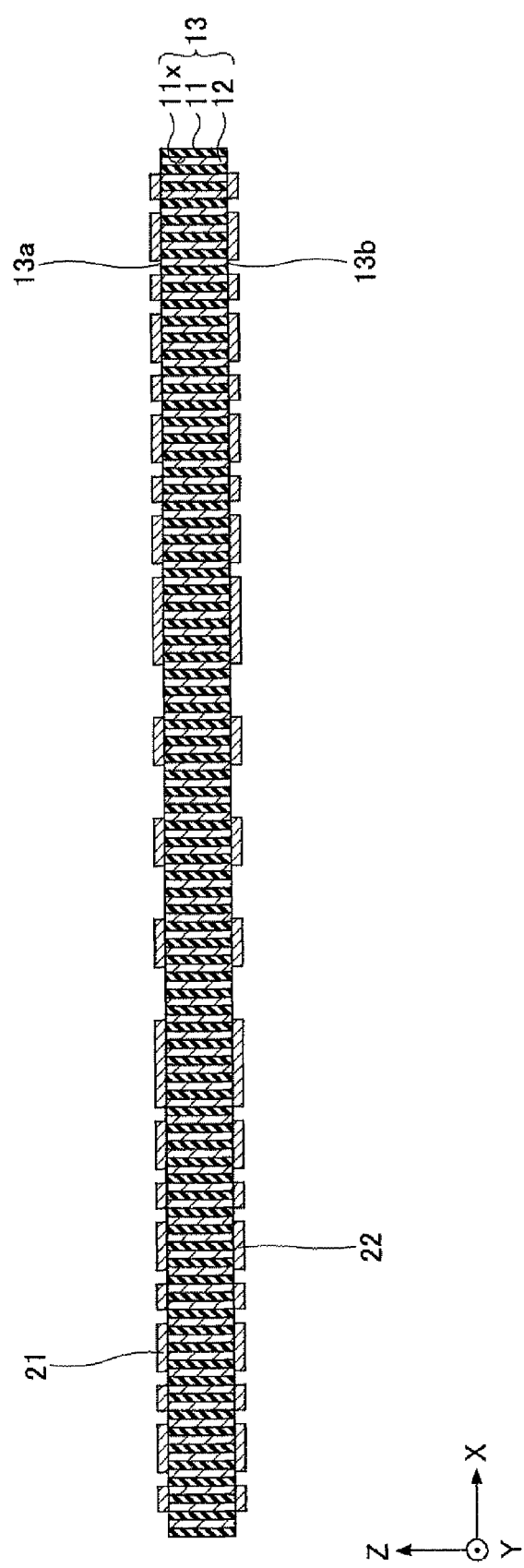
FIG. 7 is a schematic diagram for describing steps of manufacturing a wiring substrate according to the first embodiment of the present invention (part 3)

Then, in the step illustrated in FIG. 7, the first wiring layer 21 is formed on the first surface 13a of the core substrate 13. Further, the second wiring layer 22 is formed on the second surface 13b of the core substrate 13. The first and second wiring layers 21, 22 may be formed by, for example, a sputtering method or an electroplating method. The material of the first and second wiring layers 21, 22 may be, for example, copper (Cu). By completing this step, uniaxial conductive connection between the first and second wiring layers 21, 22 can be established. The term "uniaxial conductive connection" between the first and second wiring layers 21, 22 signifies that the first and second wiring layers 21, 22 can be connected by conductors (in this case, plural linear conductors 12) extending in the thickness direction (Z direction) of the wiring substrate 10 without having to extend or arrange wiring or the like in the plan view direction (X direction, Y direction, or both).

Figure 8:
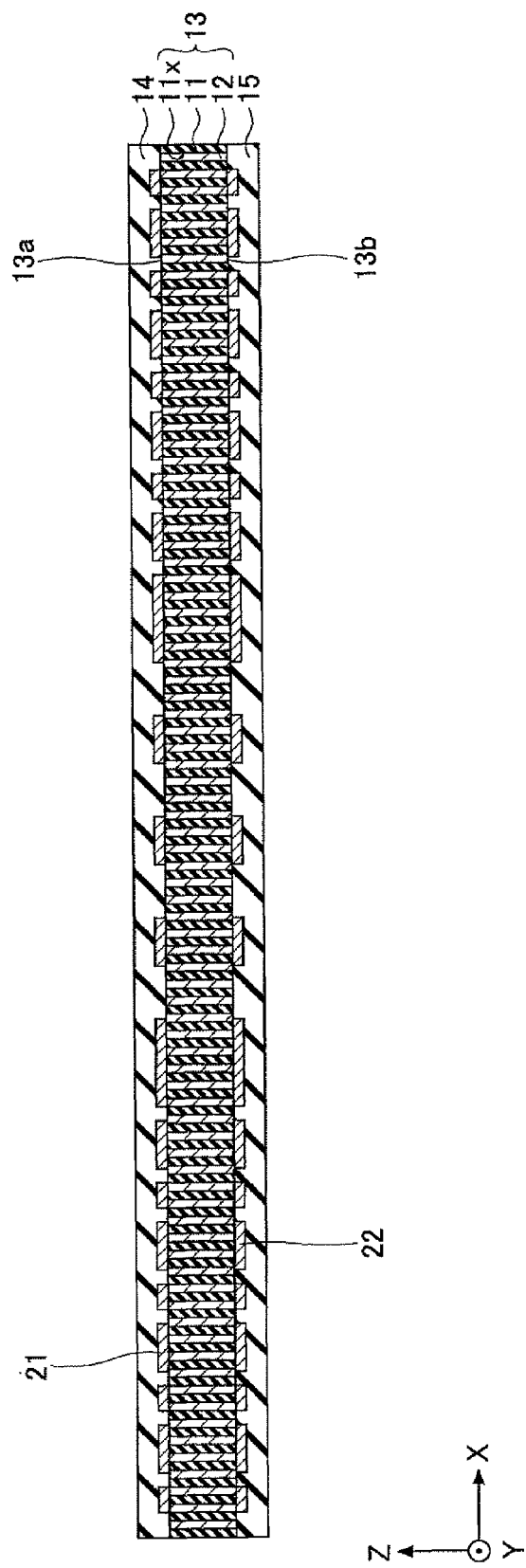
FIG. 8 is a schematic diagram for describing steps of manufacturing a wiring substrate according to the first embodiment of the present invention (part 4)

Then, in the step illustrated in FIG. 8, the first insulating layer 14 is formed on the first surface 13a of the core substrate 13 in a manner covering the first wiring layer 21. Further, the second insulating layer 15 is formed on the second surface 13b of the core substrate 13 in a manner covering the second wiring layer 22. The material of the first and second insulating layers 14, 15 may be, for example, a resin material such as epoxy resin or polyimide resin. The first and second insulating layers 14, 15 may be formed by, for example, laminating a resin film on the first and second surfaces 13a, 13b of the core substrate 13 in a manner covering the first and second wiring layers 21, 22, pressing (applying pressing force) on the resin film, and curing (thermal processing) the resin film at a temperature of approximately 190° C. Alternatively, instead of laminating a resin film, a liquid resin or a paste-like resin may be applied by using, for example, a spin-coating method.

Figure 9:
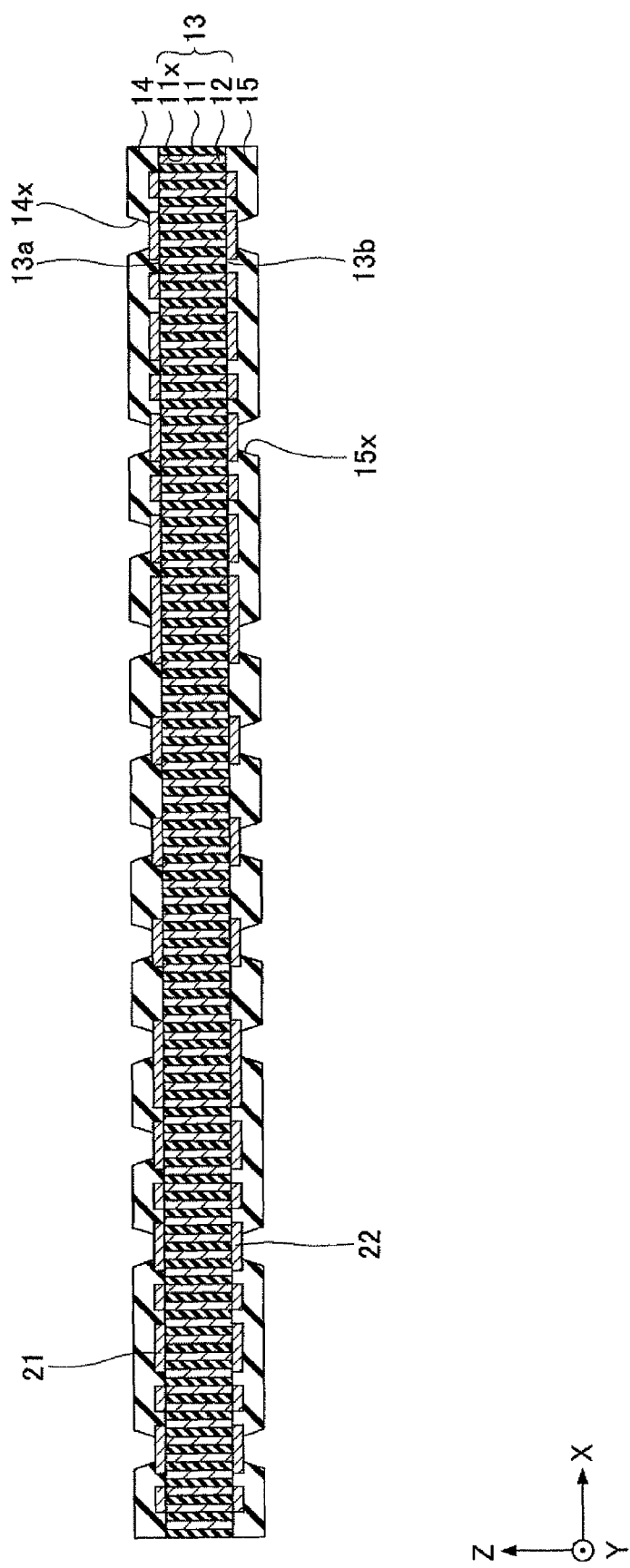
FIG. 9 is a schematic diagram for describing steps of manufacturing a wiring substrate according to the first embodiment of the present invention (part 5)

Then, in the step illustrated in FIG. 9, the first via holes 14x are formed in a manner penetrating through the first insulating layer 14. Thereby, the first surface of the first wiring layer 21 is exposed. The first via holes 14x may be formed by, for example, a laser processing method. Further, the second via holes 15x are formed in a manner penetrating through the second insulating layer 15. Thereby, the second surface of the second wiring layer 15 is exposed. The second via holes 15x may be formed by, for example, a laser processing method. For example, a $CO_2$ laser may be used in the laser processing method for forming the first and second via holes 14x, 15x.

It is to be noted that a photosensitive resin film may be used as the first and second insulating layers 14, 15. Thereby, the first and second via holes 14x, 15x may be formed by performing photolithographic patterning on the photosensitive resin film. Alternatively, the first and second via holes 14x, 14y may be formed by performing screen printing on a resin film having opening parts.

Figure 10:
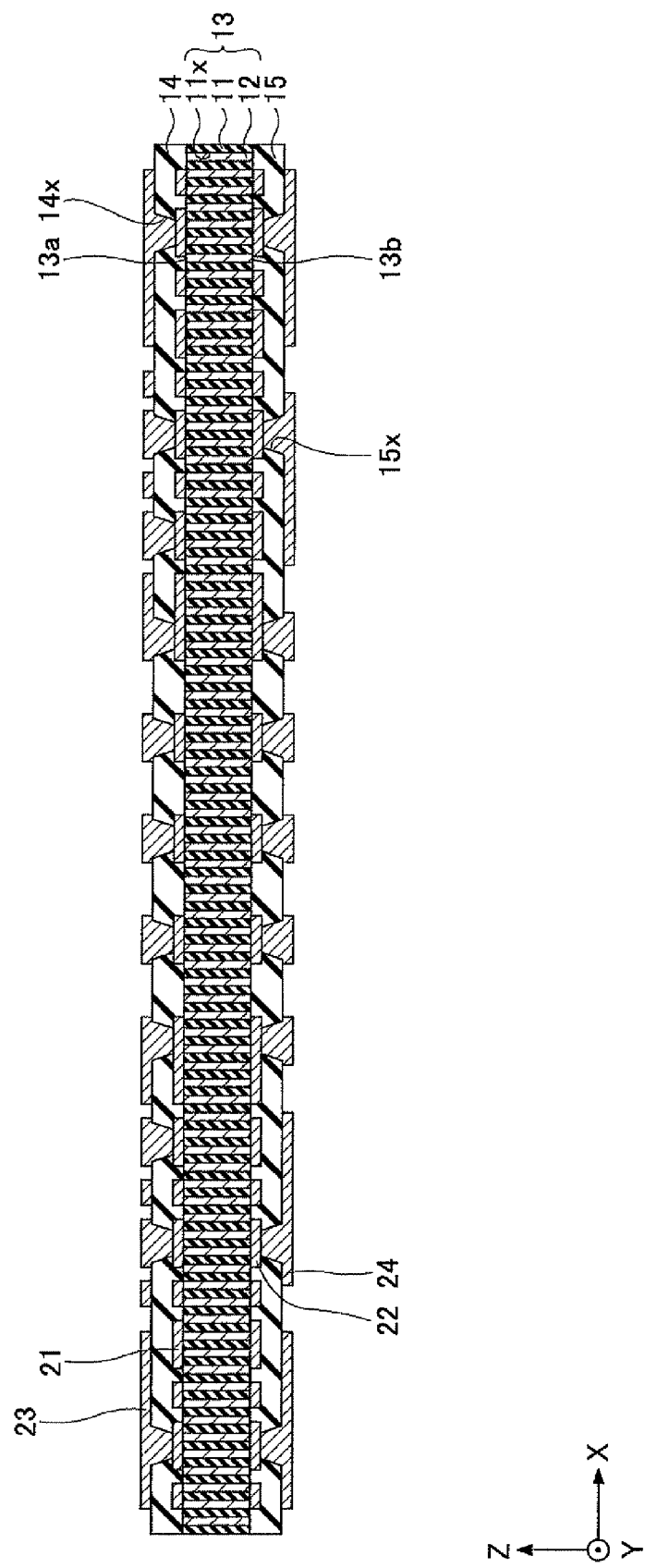
FIG. 10 is a schematic diagram for describing steps of manufacturing a wiring substrate according to the first embodiment of the present invention (part 6)

Then, in the step illustrated in FIG. 10, the third wiring layer 23 is formed on the first insulating layer 14 and the first wiring layer 21 exposed in the first via holes 14x. Thereby, the third wiring layer 23 can be electrically connected to the first wiring layer 21 exposed in the first via holes 14x. The third wiring layer 23 includes the vies filling the first via holes 14x and the wiring pattern formed on the surface of the first insulating layer 14. Further, the fourth wiring layer 24 is formed on the second insulating layer 15 and the second wiring layer 22 exposed in the second via holes 15x. Thereby, the fourth wiring layer 24 can be electrically connected to the second wiring layer 22 exposed in the second via holes 15x. The fourth wiring layer 24 includes the vias filling the second via holes 15x and the wiring pattern formed on the surface of the second insulating layer 15. The material of the first and second wiring layers 23, 24 is, for example, copper (Cu). The third and fourth wiring layers 23, 24 may be formed by, for example, a semi-additive method.

An example of forming the third wiring layer 23 by using the semi-additive method is described in detail. First, a copper (Cu) seed layer (not illustrated) is formed on the first insulating layer 14 (including the sidewalls of the first via holes 14x) and on the first wiring layer 21 exposed in the first via holes 14x. Then, a resist layer (not illustrated) having opening parts is formed. Then, a copper (Cu) layer pattern (not illustrated) is formed in the opening parts of the resist layer by performing an electroplating method using the copper (Cu) seed layer as the feed layer.

Then, after removing the resist layer, the copper (Cu) seed layer is etched by using the copper (Cu) layer pattern as a mask. Thereby, the third wiring layer 23 can be obtained. It is, however, to be noted that the third wiring layer 23 may be also be formed by using other methods such as a subtractive method. The fourth wiring layer 24 may be formed in a similar manner as that of forming the third wiring layer 23.

By completing the step illustrated in FIG. 10, uniaxial conductive connection can be established between a portion of the third wiring layer 23 and a portion of the fourth wiring layer 24 facing the portion of the third wiring layer 23 via the first wiring layer 21, the linear conductors 12, and the second wiring layer 22.

Figure 11:
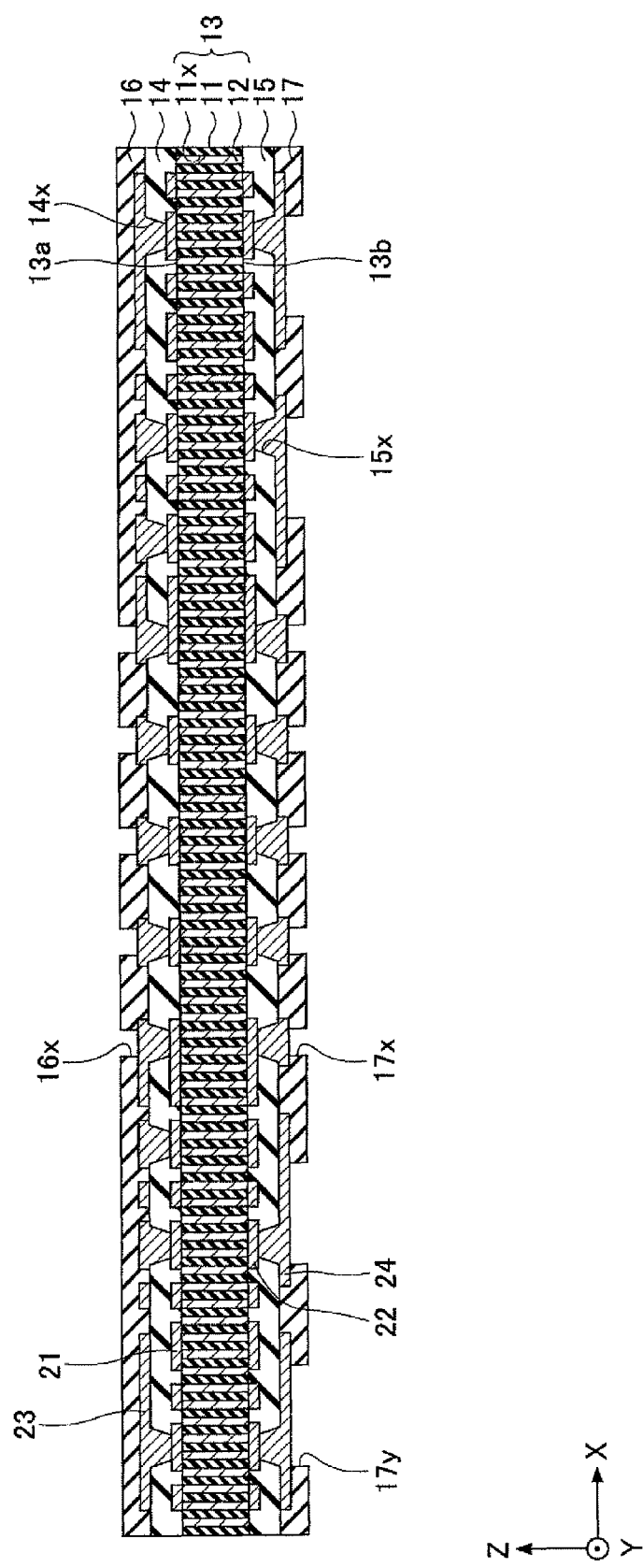
FIG. 11 is a schematic diagram for describing steps of manufacturing a wiring substrate according to the first embodiment of the present invention (part 7)

Then, in the step illustrated in FIG. 11, the first solder-resist layer 16 including opening parts 16x is formed on the first insulating layer 14 in a manner covering the third wiring layer 23. Further, the second solder-resist layer 17 including opening parts 17x is formed on the second insulating layer 15 in a manner covering the fourth wiring layer 24. The first solder-resist layer 16 including the opening parts 16x may be formed by, for example, applying a solder-resist liquid on the third wiring layer 23, exposing the solder-resist liquid with light, and developing the solder-resist liquid. The second solder-resist layer 17 including the opening parts 17x may also be formed in a similar manner as that of forming the first solder-resist layer 16. The material of the first and second solder-resist layers 16, 17 may be, for example, a photosensitive resin compound including epoxy resin or imide resin.

A portion of the third wiring layer 23 is exposed in the opening parts 16x of the first solder-resist layer 16. Further, a portion of the fourth wiring layer 24 is exposed in the opening parts 17x of the second solder-resist layer 17. A metal layer (not illustrated) may be formed on the exposed portion of the third wiring layer 23 and the exposed portion of the fourth wiring layer 24 by using, for example, an electroless plating method.

The metal layer (not illustrated) formed on the exposed portions of the third and fourth wiring layers 23, 24 may be, for example, an Au layer, a Ni/Au layer (i.e. a metal layer including a Ni layer and an Au layer layered in this order), or a Ni/Pd/Au layer (i.e. a metal layer including a Ni layer, a Pd layer, and a Au layer layered in this order). Alternatively, instead of forming the metal layer in the exposed portions of the third and fourth wiring layers 23, 24, an OSP (Organic Solderability Preservative) process may be performed on exposed portions of the third and fourth wiring layers 23, 24. Hence, by performing the steps illustrated in FIGS. 5-11, the wiring substrate 10 illustrated in FIG. 3 can be obtained.

With the above-described method of manufacturing the wiring substrate according to the first embodiment of the present invention, by forming first and second wiring layers on corresponding first and second surfaces of the core substrate made of an inorganic dielectric material and penetrated by plural linear conductors, the first and second wiring layers can be uniaxially connected via the linear conductors. Further, by forming first and second insulating layers in a manner covering corresponding surfaces of the first and second wiring layers and forming third and fourth wiring layers on corresponding first and second insulating layers, the third and fourth wiring layers can also be uniaxially connected by the linear conductors and vias.

As a result, the first and second wiring layers formed on the first and second surfaces of the core substrate and the third and fourth wiring layers can be connected with a narrow pitch and a short distance. Therefore, in a case where a semiconductor device is mounted on both sides (first and second surfaces) of a wiring substrate, the semiconductor device mounted on one side of the wiring substrate can be connected to the semiconductor device mounted on the other side of the wiring substrate with a narrow pitch and a short distance.

Further, because the core substrate can be easily manufactured by supplying a metal material into the through-holes formed by using the anodic oxidation method or the like, manufacturing cost is low compared to the method of forming through-vias (i.e. TSV (Through Silicon Via)) in a silicon substrate body. Accordingly, the wiring substrate can be manufactured at a low cost.

Further, the degree of freedom of designing the wiring substrate can be improved because the areas (locations) at which the vias are formed can be discretionally selected.

[Modified Example of First Embodiment]

FIGS. 12A and 12B illustrate a portion of a wiring substrate 10A according to a modified example of the first embodiment of the present invention. FIG. 12A is a cross-sectional view of the wiring substrate 10A. FIG. 12B is a plan view of the wiring substrate 10A for schematically illustrating conductors contacting the first surface 13a or the second surface 13b of the core substrate 13. In FIGS. 12A and 12B, like components are denoted by like reference numerals as of those of FIG. 3 and are not further explained. In FIGS. 12A and 12B, the X direction indicates a direction parallel to the first surface 13a of the core substrate 13, the Y direction indicates a direction orthogonal to the X direction (depth direction in FIG. 12A), and the Z direction indicates a direction orthogonal to both the X direction and the Y direction (thickness direction of the core substrate 13).

With reference to FIGS. 12A and 12B, the wiring substrate 10A has substantially the same configuration as that of the wiring substrate 10 except for an aspect that the first wiring layer 21 includes a first signal pattern 21s and a first ground (GND) pattern 21g, an aspect that the second wiring layer 22 includes a second signal pattern 22s and a second ground (GND) pattern 22g, an aspect that the third wiring layer 23 includes a third signal pattern 23s and a third GND pattern 23g, and an aspect that the fourth wiring layer 24 includes a fourth signal pattern 24s.

A predetermined signal current flows through the vias filling the inside of the first via holes 14x, the first wiring pattern 21s, the plural linear conductors 12, the second wiring pattern 22s, the vias filling the inside of the second via holes 15x, and the fourth wiring pattern 24s. Further, as illustrated in FIGS. 12A and 12B, the first ground pattern 21g and the second ground pattern 22g are arranged facing the first and second wiring patterns 21s, 22s and positioned a predetermined distance apart from the first and second wiring pattern 21s, 22s at the periphery of the first and second wiring patterns 21s, 22s. Further, the first ground pattern 21g and the second ground pattern 22g are electrically connected via the plural linear conductors 12. That is, among the plural linear conductors 12, a first group of linear conductors 12 are connected to the ground (first and second ground patterns 21g, 22g) of the wiring substrate 10A at predetermined intervals at the periphery of a second group of linear conductors 12 through which signal current flows.

The first ground pattern 21g is connected to the third ground pattern 23g formed on the first insulating layer 14 via third via holes 14g. That is, the first ground pattern 21g, the second ground pattern 22g, and the third ground pattern 23g are patterns connected to ground (reference electric potential).

The first ground pattern 21g and the first signal pattern 21s can be formed on the first surface 13a of the core substrate 13 by using, for example, a sputtering method or an electroplating method. Likewise, the second ground pattern 22g and the second signal pattern 22s can be formed on the second surface 13b of the core substrate 13 by using, for example, a sputtering method or an electroplating method. The third ground pattern 23g and the third signal pattern 23s can be formed on the first insulating layer 14 by using, for example, a semi-additive method. Likewise, the fourth signal pattern 24s can be formed on the second insulating layer 15 by using, for example, a semi-additive method. The material of the first-third ground patterns 21g, 22g, 23g and the first-fourth signal patterns 21s, 22s, 23s, 24s may be formed of, for example, copper (Cu).

Accordingly, among the plural linear conductors 12 of the core substrate 13, a first group of linear conductors 12 is connected to ground (first and second ground patterns 21g, 22g) of the wiring substrate 10A at predetermined intervals at the periphery of a second group of linear conductors 12 through which signal current flows. Because the configuration of the linear conductors 12 is substantially the same as that of a coaxial line, a shielding effect can be attained. Further, because the first group of linear conductors 12 connected to ground can be positioned in-between adjacently arranged plural second groups of linear conductors 12, electric coupling (capacity coupling) generated between plural second groups of linear conductors can be reduced. Thereby, the second groups of linear conductors can be prevented from becoming the source of noise.

It is to be noted that the first group of linear conductors 12 may be connected to the first ground pattern 21g, the second ground pattern 22g, and the third ground pattern 23g by filling an annular-shaped through-hole with conductors at the periphery of the first via holes 14x of the first insulating layer 14 and the second via holes 15x of the second insulating layer 15. Thus, because the first and second insulating layers 14, 15 can be formed having substantially the same configuration as the coaxial line formed in the core substrate 13, the shielding effect can be attained.

Accordingly, in addition to attaining the same effects (advantages) as the wiring substrate 10 of the first embodiment of the present invention, the wiring substrate 10A of the modified example of the first embodiment can also attain the shielding effect by forming a configuration in the wiring substrate 10A having substantially the same configuration as a coaxial line. Further, because the first group of linear conductors 12 connected to ground can be positioned in-between adjacently arranged plural second groups of linear conductors 12, electric coupling (capacity coupling) generated between plural second groups of linear conductors can be reduced. Thereby, the second group of linear conductors can be prevented from becoming the source of noise.

[Second Embodiment]

Next, a semiconductor apparatus 50 according to the second embodiment of the present invention is described. The semiconductor apparatus 50 according to the second embodiment includes a wiring substrate having a semiconductor device mounted on both first and second surfaces of the wiring substrate.

Figure 13:
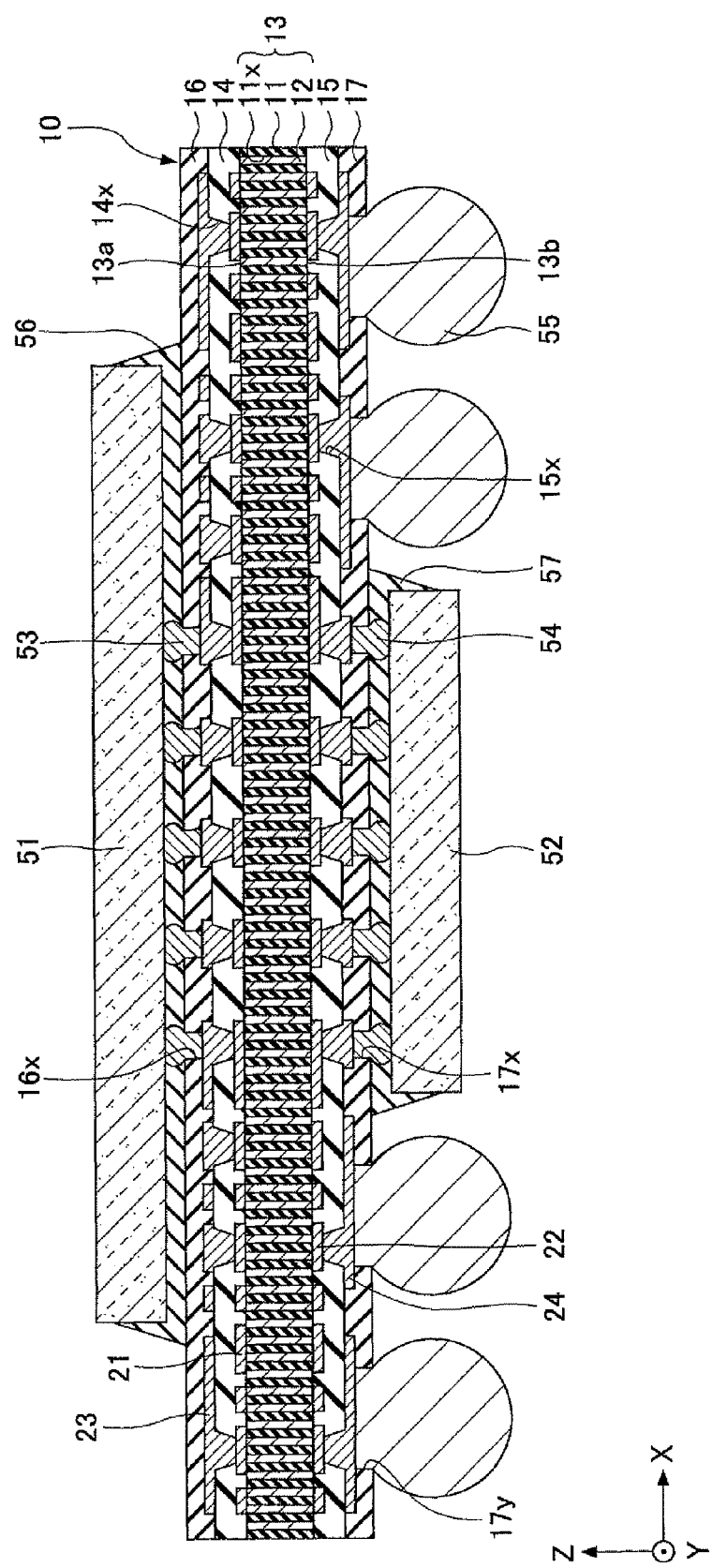
FIG. 13 is a cross-sectional view illustrating a semiconductor apparatus according to a second embodiment of the present invention.

FIG. 13 is a cross-sectional view illustrating the semiconductor apparatus 50 according to the second embodiment of the present invention. In FIG. 13, like components are denoted with like reference numerals as of those of the wiring substrate 10 of FIG. 3 and are not further explained. In FIG. 13, the X direction indicates a direction parallel to the first surface 13a of the core substrate 13, the Y direction indicates a direction orthogonal to the X direction (depth direction in FIG. 13), and the Z direction indicates a direction orthogonal to both the X direction and the Y direction (thickness direction of the core substrate 13).

In FIG. 13, the semiconductor apparatus 50 includes the wiring substrate 10, a first semiconductor device 51, a second semiconductor device 52, solder bumps 53-55, and underfill resins 56, 57.

The first semiconductor device 51 is mounted on a first surface of the wiring substrate 10. The second semiconductor device 52 is mounted on a second surface of the wiring substrate 10. The first and second semiconductor devices may be, for example, a semiconductor integrated circuit (not illustrated) mounted on a thin silicon semiconductor substrate (not illustrated) or an electrode terminal (not illustrated) mounted on a thin silicon semiconductor substrate (not illustrated). In this example, the first semiconductor device 51 may be a memory device and the second semiconductor device 52 may be a logic device. The thickness of each of the first and second semiconductor devices 51, 52 ranges from, for example, approximately 10 μm to 50 μm.

At least a portion of the electrode terminals (not illustrated) of the semiconductor device 51 is uniaxially connected to at least a portion of the electrode terminals (not illustrated) of the semiconductor device 52 (uniaxial connection). That is, at least a portion of the electrode terminals (not illustrated) of the semiconductor device 51 and at least a portion of the electrode terminals (not illustrated) of the semiconductor device 52 can be connected by conductors formed in the thickness direction of the wiring substrate 10 (Z direction) without having to extend or arrange wiring or the like in the plan direction (X direction, Y direction, or both). In this case, the conductors formed in the thickness direction (Z direction) of the wiring substrate 10 include the solder bumps 53, the third wiring layer 23, the first wiring layer 21, the linear conductors 12, the second wiring layers 22, the fourth wiring layer 24, and the solder bumps 54.

The solder bumps 53 electrically connect the electrode terminals (not illustrated) of the first semiconductor device 51 to the third wiring layer 23 exposed at the opening parts 16x of the first solder-resist layer 16. The solder bumps 54 electrically connect the electrode terminals (not illustrated) of the second semiconductor device 52 to the fourth wiring layer 24 exposed at the opening parts 17x of the second solder-resist layer 17. The solder bumps 55 are outer connection terminals for connecting to the semiconductor apparatus 50 to a target substrate such as a motherboard.

The material of the solder bumps 53-55 may be, for example, an alloy containing Pb, an alloy of Sn and Cu, an alloy of Sn and Ag, an alloy of Sn, Ag, and Cu. For example, the solder bumps 53 may be formed by printing (applying) solder paste on the third wiring layer 23 exposed at the opening parts 16x of the first solder-resist layer 16 and performing reflow on the applied solder paste. Likewise, the solder bumps 54 and 55 may be formed by using the same method for forming the solder bumps 53.

It is to be noted that the solder bumps 55 does not need to include the solder bumps 55. In this case, the solder bumps 55 may be formed on the fourth wiring layer 24 exposed at the opening parts 17y of the second solder-resist layer 17 according to necessity.

The underfill resin 56 is provided between the first semiconductor chip 51 and the first surface of the wiring substrate 10. The underfill resin 57 is provided between the second semiconductor chip 52 and the second surface of the wiring substrate 10. The underfill resin 56 is provided for improving connection reliability between the first semiconductor chip 51 and the wiring substrate 10. The underfill resin 57 is provided for improving connection reliability between the second semiconductor chip 52 and the wiring substrate 10. The material of the underfill resins 56, 57 may be, for example, a thermosetting resin such as epoxy resin.

Therefore, with the semiconductor apparatus according to the second embodiment, because the semiconductor apparatus includes the wiring substrate of the first embodiment, the semiconductor devices mounted on the first and second surfaces of the wiring substrate can be connected to each other with a narrow pitch and a short distance.

Further, because the core substrate can be easily manufactured by filling a metal material into the through-holes formed by using the anodic oxidation method or the like, manufacturing cost is low compared to the method of forming through-vias (i.e. TSV (Through Silicon Via)) in a silicon substrate body. Accordingly, the wiring substrate can be manufactured at a low cost. Hence, the semiconductor apparatus including the wiring substrate of the first embodiment can also be manufactured at a low cost.

[First Modified Example of Second Embodiment]

Figure 14:
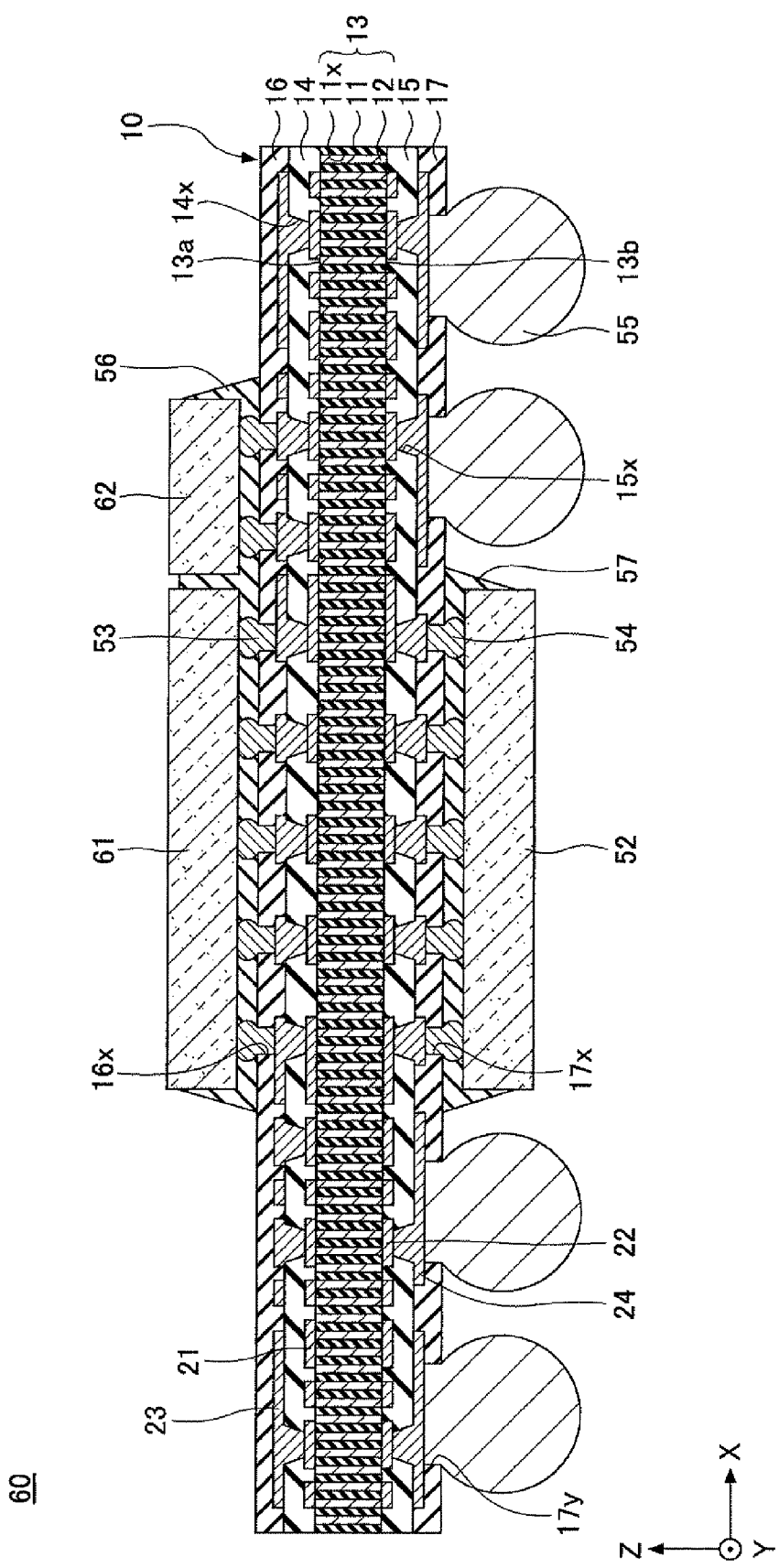
FIG. 14 is a cross-sectional view illustrating a semiconductor apparatus according to a first modified example of the second embodiment of the present invention.

FIG. 14 is a cross-sectional view illustrating a semiconductor apparatus 60 according to a first modified example of the second embodiment of the present invention. In FIG. 14, like components are denoted with like reference numerals as of those of the semiconductor apparatus 50 of FIG. 13 and are not further explained. In FIG. 14, the X direction indicates a direction parallel to the first surface 13a of the core substrate 13, the Y direction indicates a direction orthogonal to the X direction (depth direction in FIG. 14), and the Z direction indicates a direction orthogonal to both the X direction and the Y direction (thickness direction of the core substrate 13).

With reference to FIG. 14, the semiconductor apparatus 60 has substantially the same configuration as that of the semiconductor apparatus 50 of the second embodiment except for an aspect that semiconductor devices 61 and 62 are mounted on the first surface of the wiring substrate 10. In this example, the semiconductor devices 61, 62 may be memory devices and the semiconductor device 52 may be a logic device. The underfill resin 56 is provided between the first surface of the wiring substrate and the semiconductor devices 61, 62.

Therefore, in addition to attaining the same effects (advantages) of the second embodiment, the semiconductor apparatus according to the first modified example of the second embodiment can also attain the following effects (advantages). That is, size-reduction and high densification of the semiconductor apparatus can be achieved by mounting plural semiconductor devices on the wiring substrate in the plan direction (X direction, Y direction, or both).

[Second Modified Example of Second Embodiment]

According to a second modified example of the second embodiment of the present invention, a semiconductor apparatus 70 has plural semiconductor apparatuses (including the wiring substrate of the first embodiment) stacked (superposed) and electrically connected to each other.

Figure 15:
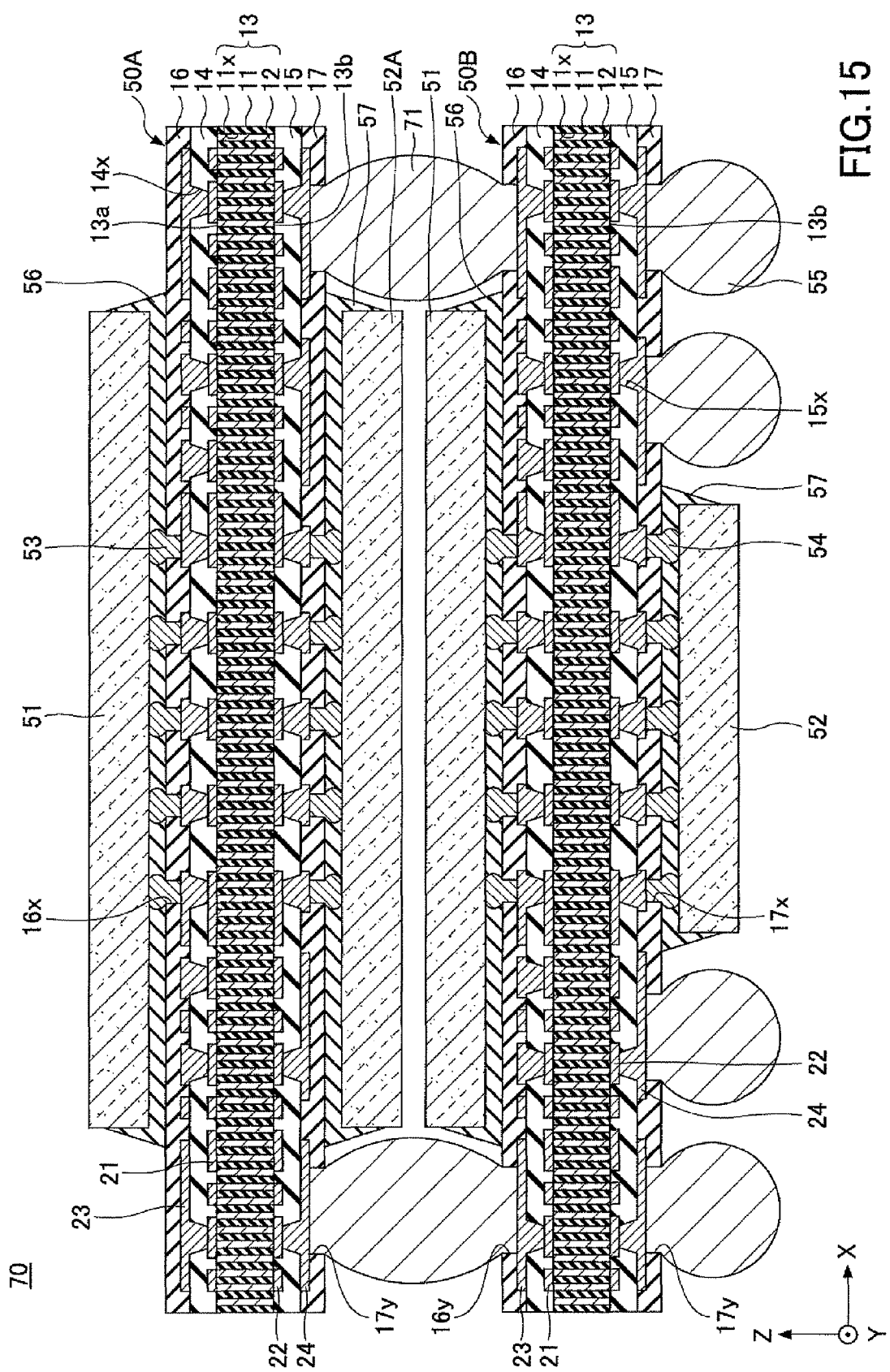
FIG. 15 is a cross-sectional view illustrating a semiconductor apparatus according to a second modified example of the second embodiment of the present invention.

FIG. 15 is a cross-sectional view illustrating the semiconductor apparatus 70 according to a second modified example of the second embodiment of the present invention. In FIG. 15, like components are denoted with like reference numerals as of those of the semiconductor apparatus 50 of FIG. 13 and are not further explained. In FIG. 15, the X direction indicates a direction parallel to the first surface 13a of the core substrate 13, the Y direction indicates a direction orthogonal to the X direction (depth direction in FIG. 15), and the Z direction indicates a direction orthogonal to both the X direction and the Y direction (thickness direction of the core substrate 13).

In FIG. 15, the semiconductor apparatus 70 has a configuration including stacked (superposed) first and second semiconductor apparatuses 50A, 50B that are electrically connected to each other via solder bumps 71. In this example, the semiconductor apparatus 50A is configured having the semiconductor device 52 of the semiconductor apparatus 50 of FIG. 13 replaced with a semiconductor device 52A. The semiconductor device 52A may be a logic device. Further, the semiconductor apparatus 50B is configured having opening parts 16y added to the first solder-resist layer 16 of the semiconductor device 50 of FIG. 13. The solder bumps 71 electrically and mechanically connect the fourth wiring layer 24 exposed at the opening parts 17y of the second solder-resist layer 17 and the third wiring layer 23 exposed at the opening parts 16y of the first solder-resist layer 16. The material of the solder bumps 71 may be, for example, an alloy containing Pb, an alloy of Sn and Cu, an alloy of Sn and Ag, or an alloy of Sn, Ag, and Cu.

Therefore, in addition to attaining the same effects (advantages) of the second embodiment, the semiconductor apparatus according to the second modified example of the second embodiment can also attain the following effects (advantages). That is, size-reduction and high densification of the semiconductor apparatus can be achieved by stacking plural semiconductor apparatuses including the wiring substrate of the first embodiment.

Further, the present invention is not limited to these embodiments, but variations and modifications may be made without departing from the scope of the present invention.

For example, the manufacturing of the first and second modified examples of the second embodiment may be performed substantially at the same time. By mounting plural semiconductor devices in the plan direction (X direction, Y direction, or both) and in the vertical direction (Z direction), further size-reduction and higher densification of the semiconductor apparatus can be achieved.

Alternatively, the wiring substrate 10A may be used instead of the wiring substrate 10 in the second embodiment and the first or second modified examples of the second embodiment.

Further, three or more semiconductor devices may be mounted on the wiring substrate of the semiconductor apparatus in the plan direction (X direction, Y direction, or both), and three or more semiconductor devices may be mounted on the wiring substrate of the semiconductor apparatus in the vertical direction (Z direction).

The present application is based on Japanese Priority Application No. 2010-010950 filed on Jan. 21, 2010, with the Japanese Patent Office, the entire contents of which are hereby incorporated by reference.

What is claimed is:

1. A wiring substrate comprising:
a core substrate including
an insulating base material made of an inorganic dielectric material and having first and second surfaces, and
a plurality of linear conductors penetrating through the insulating base material from the first surface to the second surface;
a first wiring layer formed on the first surface and electrically connected to a portion of the plural linear conductors at the first surface;
a second wiring layer formed on the second surface and electrically connected to the portion of the plural linear conductors at the second surface;
a first insulating layer being formed on the first surface in a manner covering the first wiring layer and including a first through-hole;
a third wiring layer formed on the first insulating layer and electrically connected to the first wiring layer via the first through-hole;
a second insulating layer being formed on the second surface in a manner covering the second wiring layer and including a second through-hole; and
a fourth wiring layer formed on the second insulating layer and electrically connected to the second wiring layer via the second through-hole;
wherein the first and second wiring layers are electrically connected to each other via the portion of the plural linear conductors,
wherein the first wiring layer, the second wiring layer, the third wiring layer, and the fourth wiring layer include a signal wiring,
wherein the first wiring layer, the second wiring layer, and the third wiring layer include a ground wiring,
wherein the plural linear conductors include a first group of linear conductors connected to the ground wiring and a second group of linear conductors connected to the signal wiring,
wherein the first group of linear conductors is positioned at a periphery of the second group of linear conductors.

2. The wiring substrate as claimed in claim 1, wherein the plural linear conductors include a linear conductor that is electrically connected to respective conductors provided in one of the first and second through-holes.

3. The wiring substrate as claimed in claim 1, wherein the plural linear conductors include a linear conductor that is not electrically connected to respective conductors provided in one of the first and second through-holes.

4. The wiring substrate as claimed in claim 1, wherein each of the plural linear conductors has a diameter ranging from 30 nm to 2000nm.

5. A semiconductor apparatus comprising:
the wiring substrate of claim 1;
wherein the wiring substrate has first and second surfaces, wherein a first semiconductor device is mounted on the first surface of the wiring substrate and a second semiconductor device is mounted on the second surface of the wiring substrate.

6. The semiconductor apparatus as claimed in claim 5, wherein the first semiconductor device includes a plurality of first electrode pads, wherein the second semiconductor device includes a plurality of second electrode pads, wherein uniaxial conductive connection is established between at least a portion of the first electrode pads and at least a portion of the second electrode pads.

7. The semiconductor apparatus as claimed in claim 5, wherein at least a third semiconductor device is mounted on the first surface or the second surface of the wiring substrate.

8. A semiconductor apparatus comprising:
plural of the semiconductor apparatuses claimed in claim 5;
wherein the plural semiconductor apparatuses are superposed and electrically connected to one another.

* * * * *